(12) United States Patent
Nguyen et al.

(10) Patent No.: US 10,121,665 B2
(45) Date of Patent: Nov. 6, 2018

(54) SHORT-CHANNEL NFET DEVICE

(71) Applicant: GLOBALFOUNDRIES Inc., Grand Cayman (KY)

(72) Inventors: Chi Dong Nguyen, Radebeul (DE); Klaus Hempel, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/646,570

(22) Filed: Jul. 11, 2017

(65) Prior Publication Data

US 2017/0316944 A1 Nov. 2, 2017

Related U.S. Application Data

(62) Division of application No. 14/667,778, filed on Mar. 25, 2015, now Pat. No. 9,735,012.

(51) Int. Cl.
| | |
|---|---|
| *H01L 29/10* | (2006.01) |
| *H01L 29/66* | (2006.01) |
| *H01L 21/265* | (2006.01) |

(52) U.S. Cl.
CPC .. *H01L 21/26506* (2013.01); *H01L 21/26586* (2013.01); *H01L 29/1083* (2013.01); *H01L 29/6659* (2013.01); *H01L 21/26513* (2013.01); *H01L 29/6656* (2013.01)

(58) Field of Classification Search
None
See application file for complete search history.

(56) References Cited

U.S. PATENT DOCUMENTS

| | | | |
|---|---|---|---|
| 2010/0003799 A1* | 1/2010 | Lee | H01L 21/2236 438/305 |
| 2010/0065914 A1 | 3/2010 | Lin | |
| 2012/0098590 A1 | 4/2012 | Edwards et al. | |
| 2015/0041916 A1 | 2/2015 | Yu et al. | |

OTHER PUBLICATIONS

Chinese Official Action dated Mar. 29, 2018 for Chinese patent application No. 201610178035.3.
Taiwanese Examination Report dated Jan. 23, 2017 for Taiwan patent application No. 105106866.

* cited by examiner

*Primary Examiner* — Raj R Gupta
(74) *Attorney, Agent, or Firm* — Amerson Law Firm, PLLC

(57) ABSTRACT

A semiconductor device has an active region that includes a semiconductor layer. A transistor is formed in and above the active region, wherein the transistor has an implanted halo region that includes a halo dopant species and defines a halo dopant profile in the semiconductor layer. An implanted carbon species is positioned in the semiconductor layer, wherein the implanted carbon species defines a carbon species profile in the semiconductor layer that is substantially the same as the halo dopant profile of the implanted halo region in the semiconductor layer.

15 Claims, 2 Drawing Sheets

SHORT-CHANNEL NFET DEVICE

BACKGROUND

1. Field of the Disclosure

Generally, the subject matter disclosed herein is related to sophisticated integrated circuits, and more particularly to short-channel NMOS transistor devices and improved N-channel MOSFETs that have reduced diffusion of halo species.

2. Description of the Related Art

Integrated circuits formed on semiconductor wafers typically include a large number of circuit elements, which form an electric circuit. In addition to active devices such as, for example, field effect transistors and/or bipolar transistors, integrated circuits can include passive devices such as resistors, inductors and/or capacitors. In particular, during the fabrication of complex integrated circuits using CMOS technology, millions of transistors, i.e., N-channel transistors and P-channel transistors, are formed on a substrate including a crystalline semiconductor layer.

A MOS transistor, for example, irrespective of whether an N-channel transistor or a P-channel transistor is considered, comprises so-called PN junctions that are formed by an interface of highly doped drain and source regions with an inversely or weakly doped channel region disposed between the drain region and the source region. The conductivity of the channel region, i.e., the drive current capability of the conductive channel, is controlled by a gate electrode formed near the channel region and separated therefrom by a thin insulating layer.

The conductivity of the channel region, upon formation of a conductive channel due to the application of an appropriate control voltage to the gate electrode, depends on, among other things, the dopant concentration, the mobility of the majority charge carriers and, for a given extension of the channel region in the transistor width direction, the distance between the source and drain regions, which is also referred to as channel length.

Hence, in combination with the capability of rapidly creating a conductive channel below the insulating layer upon application of the control voltage to the gate electrode, the overall conductivity of the channel region substantially determines the performance of the MOS transistors.

Nowadays, the ongoing demand for miniaturization of semiconductor devices of ICs results in the fabrication of MOS transistors with channel lengths of below some 70 or 60 nm. For such dimensions, the reverse short-channel effect poses severe problems for reliable operation of the short-channel MOSFETs. The reverse short-channel effect can be described as an increase of the threshold voltage with decrease of the channel length.

One reason for the reverse short-channel effect can be seen in the diffusion of channel implants induced, for example, by source/drain extension implants or deep source/drain implants or halo implants. Oxidation enhanced diffusion caused by the injection of self-interstitials causes severe problems in this context. This kind of silicon point defects particularly promote the diffusion of halo species, as boron, used as a halo implant in the manufacturing of N-channel MOSFETs. In fact, it turned out that the diffusivity of boron is mainly determined by the concentration of silicon self-interstitials caused during oxidation procedures.

In the art it is known to provide carbon implants in order to suppress the diffusion of halo species, for example, boron diffusion. However, present carbon implantation in channels of thin-film transistors (TFTs) does not reliably suppress the enhanced diffusion of halo species, particularly boron, and, thus, the above-mentioned reverse short-channel effect.

Therefore, it is an object of the presently disclosed subject matter to eliminate, or at least mitigate, some of the above-described problems associated with halo species diffusion, in particular boron diffusion, in N-channel thin-film transistors.

SUMMARY OF THE DISCLOSURE

The following presents a simplified summary of the disclosure in order to provide a basic understanding of some aspects of the subject matter that is described in further detail below. This summary is not an exhaustive overview of the disclosure, nor is it intended to identify key or critical elements of the subject matter disclosed here. Its sole purpose is to present some concepts in a simplified form as a prelude to the more detailed description that is discussed later.

Generally the subject matter disclosed herein relates to N-channel thin-film transistors (TFTs) with halo implantations in the channel region. In one exemplary embodiment, a semiconductor device is disclosed that has an active region that includes a semiconductor layer. Furthermore, the disclosed semiconductor device includes, among other things, a transistor that is formed in and above the active region, wherein the transistor has an implanted halo region that includes a halo dopant species and defines a halo dopant profile in the semiconductor layer. Additionally, an implanted carbon species is positioned in the semiconductor layer, wherein the implanted carbon species defines a carbon species profile in the semiconductor layer that is substantially the same as the halo dopant profile of the implanted halo region in the semiconductor layer.

In another illustrative embodiment disclosed herein, an exemplary semiconductor device includes a semiconductor layer that is positioned above a substrate and an isolation region that is positioned in the semiconductor layer and defines an active region, wherein the active region has a doped well region that includes dopants of a first conductivity type. Additionally, the disclosed semiconductor device includes a transistor that is formed in and above the doped well region, wherein the transistor has an implanted halo region that includes a halo dopant species that has the first conductivity type and defines a halo dopant profile in the semiconductor layer. Furthermore, an implanted carbon species is positioned in the semiconductor layer, wherein the implanted carbon species defines a carbon species profile in the semiconductor layer that is substantially the same as the implanted halo dopant profile of the halo region in the semiconductor layer.

BRIEF DESCRIPTION OF THE DRAWINGS

The disclosure may be understood by reference to the following description taken in conjunction with the accompanying drawings, in which like reference numerals identify like elements, and in which.

Figure 1A:
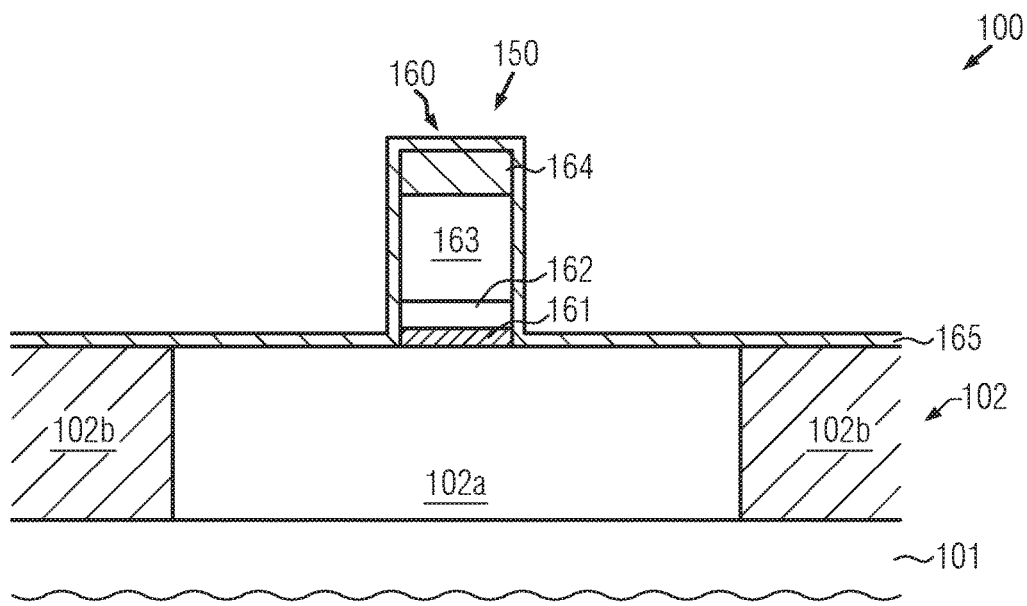
FIGS. 1a and 1b are schematic cross-sectional views that illustrate a process flow for manufacturing an N-channel transistor device in accordance with one exemplary embodiment of the present disclosure wherein carbon is implanted in the channel region.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the subject matter defined by the appended claims to the particular forms disclosed, but on the contrary, the intention is to cover all modifications, equivalents, and alternatives falling within the spirit and scope of the claimed subject matter.

DETAILED DESCRIPTION

Various illustrative embodiments of the present subject matter are described below. In the interest of clarity, not all features of an actual implementation are described in this specification. It will of course be appreciated that in the development of any such actual embodiment, numerous implementation-specific decisions must be made to achieve the developers' specific goals, such as compliance with semiconductor device-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The following embodiments are described in sufficient detail to enable those skilled in the art to practice the subject matter of the present disclosure. It is to be understood that other embodiments would be evident, based on the present disclosure, and that semiconductor device, structure, process or mechanical changes may be made without departing from the scope of the present disclosure. In the following description, numeral-specific details are given to provide a thorough understanding of the disclosure. However, it would be apparent that the embodiments of the disclosure may be practiced without the specific details. In order to avoid obscuring the present disclosure, some well-known circuits, semiconductor device configurations, structure configurations and process steps are not disclosed in detail.

The present subject matter will now be described with reference to the attached figures. Various semiconductor devices, structures and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

As used in this description and in the appended claims, the terms "substantial" or "substantially" are intended to conform to the ordinary dictionary definition of that term, meaning "largely but not wholly that which is specified." As such, no geometrical or mathematical precision is intended by the use of terms such as "substantially flat," "substantially perpendicular," "substantially parallel," "substantially circular," "substantially elliptical," "substantially rectangular," "substantially square," "substantially aligned," and/or "substantially flush," and the like. Instead, the terms "substantial" or "substantially" are used in the sense that the described or claimed component or surface configuration, position, or orientation is intended to be manufactured, positioned, or oriented in such a configuration as a target. For example, the terms "substantial" or "substantially" should be interpreted to include components and surfaces that are manufactured, positioned, or oriented as close as is reasonably and customarily practicable within normally accepted tolerances for components of the type that are described and/or claimed. Furthermore, the use of phrases such as "substantially conform" or "substantially conforms" when describing the configuration or shape of a particular component or surface, such as by stating that "the configuration of the component substantially conforms to the configuration of a cube" should be interpreted in similar fashion.

Furthermore, it should be understood that, unless otherwise specifically indicated, any relative positional or directional terms that may be used in the descriptions set forth below—such as "upper," "lower," "above," "below," "over," "under," "top," "bottom," "vertical," "horizontal," "lateral," and the like—have been included so as to provide additional clarity to the description, and should be construed in light of that term's normal and everyday meaning relative to the depiction of the components or elements in the referenced figures. For example, referring to the schematic cross-sectional view of the semiconductor device 100 depicted in FIGS. 1a and 1b, it should be understood that the gate electrode structure 160 is depicted as being positioned "above" the active region 102a, and the isolation region 102b is depicted as being "below" the protective liner 165 and "laterally" adjacent to the active region 102a. Additionally, the "top" or "upper" surface of the active region 102a as shown in FIGS. 1a and 1b is depicted as being substantially "horizontally" oriented, and the halo regions 102h are shown as extending "below" the "lower" boundaries of the drain and source extension regions 151e.

Generally, manufacturing techniques and semiconductor devices in which N-channel transistors are formed are described wherein carbon doping is performed in order to reduce the diffusion of halo species in a channel region, in particular boron diffusion of boron halo implants. Particularly, the carbon doping of the channel region is achieved by co-implantation with the halo species at a finite tilt angle. In particular, the halo species and the carbon species may be implanted at the same tilt angle and with the same implantation energy.

An exemplary process flow for manufacturing an N-channel transistor device in accordance with one illustrative embodiment of the present disclosure wherein carbon is co-implanted with a halo species in the channel region is described below with reference to FIGS. 1a and 1b.

Figure 1B:
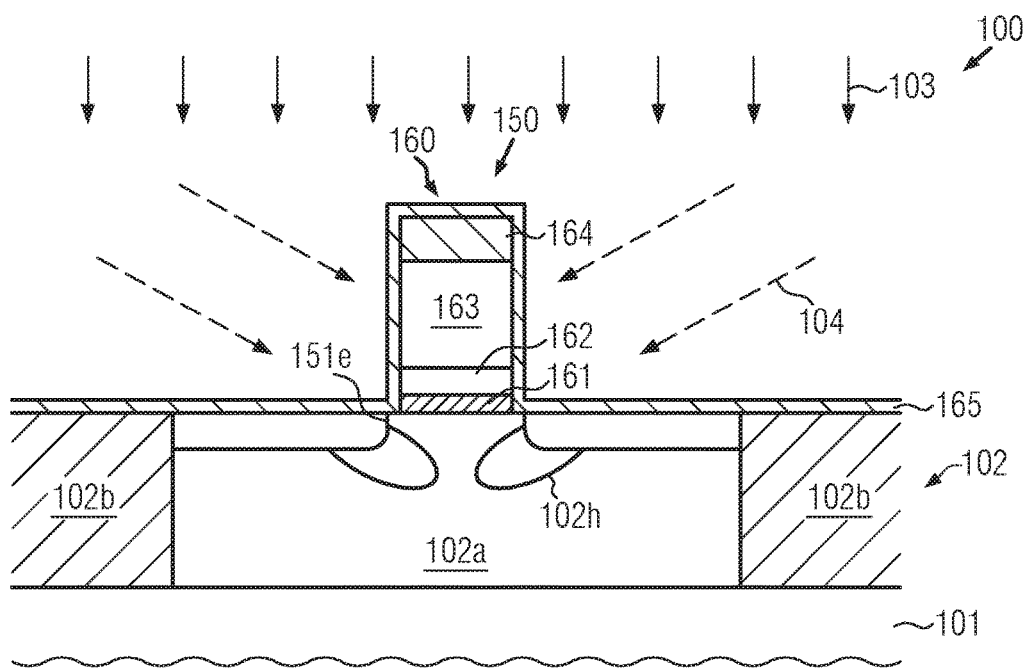

FIG. 1a schematically illustrates a cross-sectional view of a semiconductor device 100 comprising a substrate 101, above which is provided a semiconductor layer 102. The semiconductor layer 102 is typically divided into a plurality of semiconductor regions or active regions, which are to be understood as regions in and above which at least one transistor is to be formed. For convenience, a single active region 102a of an N-channel transistor 150 is illustrated in FIG. 1a. The active region 102a is laterally delineated by isolation regions 102b, which may represent shallow trench isolations (STI). A P-well is formed in the active region 102a by appropriate implantation.

The semiconductor layer 102 may comprise (include) a significant amount of silicon due to the fact that semiconductor devices of high integration density may be formed in volume production on the basis of silicon due to the enhanced availability and the well-established process techniques developed over the last decades. However, any other appropriate semiconductor materials may be used, for instance, a silicon-based material containing other iso-electronic components, such as germanium, carbon, silicon/germanium, silicon/carbon, other II-VI or III-V semiconductor compounds and the like. The substrate 101 may be any substrate that can suitably be used, for example, a semiconductor substrate comprising silicon, in particular, single crystal silicon, or germanium or a mixture of both or gallium phosphate, gallium arsenide, for example.

For example, the substrate 101 and the semiconductor layer 102 may be part of a silicon-on-insulator (SOI) wafer that comprises a buried insulating layer (not shown) positioned between the semiconductor layer 102 and the substrate 101. The buried insulating layer may be a buried oxide (BOX) layer that may comprise silicon (di)oxide, for example, borosilicate glass. The BOX layer may be composed of different layers and one of the different layers may comprise borophosphosilicate glass (BPSG) or an $SiO_2$—compound comprising boron or phosphorus. The thickness of the semiconductor layer 102 may be in the range of 5-30 nm, in particular 5-15 nm, and the thickness of the BOX layer may lie in the range of 10-50 nm.

In the manufacturing stage shown in FIG. 1a, the transistor 150 comprises a gate electrode structure 160, which in turn may comprise a gate dielectric layer 161 including a high-k dielectric material, possibly in combination with a conventional dielectric material, depending on the overall process and device requirements. For example, the gate dielectric layer 161 may comprise hafnium oxide, zirconium oxide and the like. The gate dielectric layer 161 may comprise a high-k gate insulation layer. The high-k gate insulation layer may be formed on an oxide layer and may be comprised of a variety of high-k materials (k value greater than 10), such as hafnium oxide, hafnium silicate, lanthanum oxide, zirconium oxide, etc. The thickness of the layer of high-k insulating material may vary depending upon the particular application, e.g., it may have a thickness of about 2-3 nm.

Furthermore, a metal-containing electrode material 162, such as titanium nitride, tantalum nitride and the like, may be formed above the gate dielectric layer 161, followed by a semiconductor-based electrode material 163, such as amorphous and/or polycrystalline silicon and the like. The metal-containing electrode material 162 may comprise a plurality of layers comprising different metal species. The work function of the gate electrode 160 can be appropriately adjusted by the metal species. Furthermore, a dielectric cap layer or layer semiconductor device 164, such as a silicon nitride or silicon oxide material, for example, is typically formed on the electrode material 163.

The gate electrode structure 160 may have any appropriate gate length, i.e., in FIG. 1a, the horizontal extension of the gate electrode structure 160 corresponds to a gate length of 50 nm and less, such as 35 nm and less, for example. In the shown manufacturing stage, the gate electrode structure 160 and the active region 102a are covered by a protective liner or liner semiconductor device 165, for instance comprised of silicon nitride, silicon dioxide and the like.

The semiconductor device 100 as shown in FIG. 1a may be formed on the basis of the following process strategy. The isolation region 102b may be formed on the basis of sophisticated lithography, etch, deposition, anneal and planarization techniques, thereby also defining the lateral size, position and shape of the active region 102a. Prior to or after forming the isolation region 102b, dopant species may be incorporated into the active region 102a so as to adjust the basic electronic characteristics for an N-channel transistor to be formed in and above the active region 102a.

Next, a process sequence is applied in which the sensitive materials 161 and 162 are formed, which may include appropriate deposition and patterning strategies in order to provide a high-k dielectric material in combination with a metal-containing electrode material, wherein, if required, additional anneal processes may be applied so as to incorporate a work function adjusting metal species, such as lanthanum, in the dielectric layer 161 and/or in the electrode layer 162.

Thereafter, the semiconductor material 163 in combination with one or more cap materials, such as the layer 164, are deposited by applying any appropriate deposition technique, followed by a complex lithography and etch sequence in order to form the gate electrode structure 160 from the resulting layer stack. Consequently, on the basis of the above-described process sequence, the electronic characteristics of the high-k metal gate electrode structure 160 may be adjusted in an early manufacturing stage, which, however, requires a reliable confinement of the sensitive materials 161, 162. To this end, the liner 165 is provided, for instance in the form of a silicon dioxide material, a silicon nitride material or possibly a combination of these layers, which may be deposited by using well-established deposition techniques, such as multi-layer deposition processes and the like.

FIG. 1b schematically illustrates the semiconductor device 100 in a further advanced manufacturing stage. As shown, an implantation sequence may be applied in order to introduce dopant species into the active region 102a. To this end, an implantation process 103 may be performed so as to incorporate drain and source dopant species, thereby preliminarily forming drain and source extension regions 151e having a desired dopant concentration and depth. The implantation process 103 may be performed on the basis of appropriate process parameters so as to incorporate the dopant species through the layer 165. The implantation process 103 may be performed with a direction substantially perpendicular to the surface of the semiconductor layer 102 as indicated by the solid arrows in FIG. 1b.

Moreover, a tilted implantation process 104 may be applied so as to incorporate a counter-doping species (P-type species) with respect to the dopant species of the drain and source extension regions 151e, thereby forming counter-doped regions, i.e., halo regions 102h. In particular, the counter-doping species may comprise boron.

The ion implant process 104 can be performed at an angle relative to the vertical direction which may vary between about 20-40 degrees as indicated by the dashed arrows shown in FIG. 1b. It should be appreciated that other device areas may be reliably covered by appropriate implantation masks in accordance with well-established masking regimes. Hence, during the implantation processes 103, 104 and associated resist removal processes, the sensitive materials of the gate electrode structure 160 may be reliably covered by the liner 165.

The ion implant process 104 does not only comprise the implantation of a halo species but, additionally, carbon is co-implanted in order to achieve a reduction of diffusion of the halo species in later processing steps. For example, the halo species, for instance boron, may be implanted during the ion implant process 104 with a tilt angle (measured with respect to a normal direction of the surface of the active region 102a, i.e., with respect to a direction perpendicular to the surface of the semiconductor layer) between 10-50 degrees, for example, 20-40 degrees. In particular, the carbon species may be implanted with the same tilt angle and/or the same implantation energy as the halo species.

Implantation energies for the halo species may be in the range of 5-10 keV, for example, 6-8 keV. The density of the halo dopants may be adjusted to about $10^{13}$ to $10^{14}$ cm$^{-2}$. The additional carbon species may be implanted with the same tilt angle as the halo species and comparable implantation energies in the range of 5-10 keV or 6-8 keV. The density of the carbon dopants may be adjusted to about $10^{14}$ to $10^{15}$ cm$^{-2}$. In principle, it might be preferred to substantially match the dopant profiles of the halo component and the co-implanted carbon.

The configuration shown in FIG. 1b might be subject to an anneal process in which appropriate temperatures are applied to the device 100 so as to re-crystallize implantation-induced damage in the active region 102a. Moreover, appropriate activation of the dopant species may be accomplished during the same and/or one or snore additional anneal process. For this purpose, any well-established techniques, such as laser-based anneal processes, rapid thermal anneal techniques, flashlight-based anneal processes and the like, may be applied. After the anneal process, the extension regions 151e and the halo regions 102h as well as the implanted carbon species have appropriate profiles, while also a desired high crystal quality has been re-established.

Exhaustive experiments performed by the inventors have shown that the undesired diffusion of halo components described above can be significantly reduced by the thus performed co-implantation of carbon after anneal treatments performed after the co-implantation. A better channel connection and suppression of short channel effects as punch through and high leakage currents can be achieved. Thereby, a higher drive current and lower off current can be obtained and the overall operation reliability of the N-channel transistor can be increased.

Figure 2A:
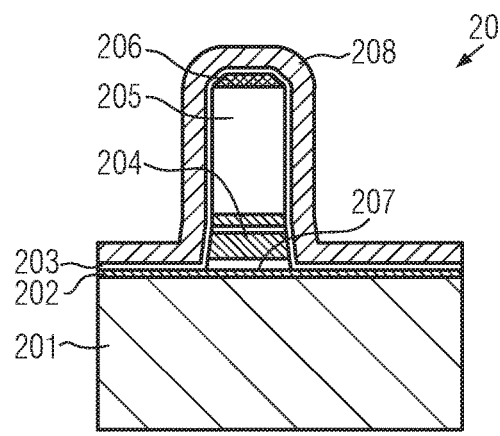
FIGS. 2a-2d are schematic cross-sectional views that depict another process flow for manufacturing an N-channel transistor device in accordance with yet another illustrative embodiment of the presently disclosed subject matter wherein carbon is implanted in the channel region.

Another exemplary embodiment of a process flow for manufacturing a semiconductor device according to the present disclosure is depicted in FIGS. 2a-2d. In particular, FIG. 2a schematically illustrates a cross-sectional view of a semiconductor device 200 comprising a semiconductor layer 201 that might be formed on a buried oxide layer (not shown) formed on a substrate (not shown). A P-well may be formed in the semiconductor layer 201. The semiconductor layer may comprise silicon. As described with reference to FIG. 1a, the semiconductor layer 201 may be laterally delineated by isolation regions (not shown in FIG. 2a), which may represent STI. A thin interfacial oxide layer 202, for example a silicon oxide layer, is formed on the surface of the semiconductor layer 201 by thermal oxidation. A liner 203 is formed on the interfacial oxide layer 202 and a gate electrode. The liner may comprise a silicon dioxide material, a silicon nitride material or a combination of these layers, which may be deposited by using well-established deposition techniques, such as multi-layer deposition processes and the like.

The gate electrode comprises multiple layers 204 containing metals and a polysilicon gate material 205 covered by an oxide cap 206. The metal gate layers 204 are formed on a high-k gate dielectric layer 207. For example, the high-k gate dielectric layer 207 may comprise hafnium oxide, zirconium oxide and the like. A work function adjusting metal species, such as lanthanum, may be incorporated in the lowest one of the metal containing layers 204 and/or in the dielectric layer 207. The oxide layer 203 contributes to the gate dielectric. Further, a first spacer layer 208, for example formed of an oxide material, is formed on the liner 203. The first spacer layer 208 may be formed by low pressure chemical vapor deposition.

Figure 2B:
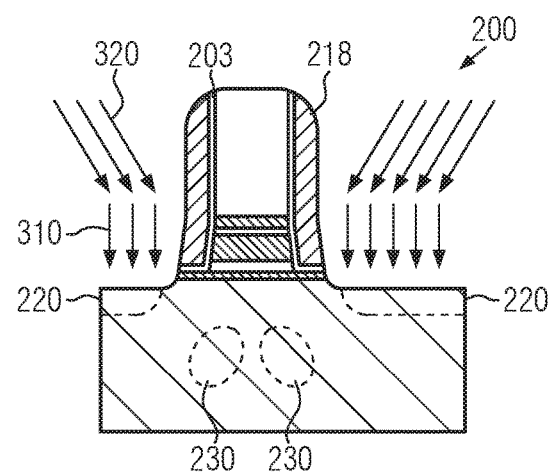

FIG. 2b schematically illustrates the semiconductor device 200 in a further advanced manufacturing stage. In this stage, the first spacer layer 208 has been etched in order to form first sidewall spacers 218. Both the liner layer 203 and the thin interfacial oxide layer 202 are also removed where not covered by the gate electrode and first sidewall spacers 218. During removal of the thin oxide layer from the surface of the semiconductor layer 201, the oxide cap 206 formed on the polysilicon gate may also be partially or fully removed.

An implantation process 310 may be carried out in order to form drain and source extension regions 220 having a desired dopant concentration and depth. The implantation process may be performed perpendicular to the surface of the semiconductor layer 201, i.e., with a tilt angle of zero. Moreover, a tilted implantation process 320 may be carried out so as to incorporate a counter-doping species (P-type species) with respect to the dopant species of the drain and source extension regions 220, thereby forming counter-doped regions or halo regions 230. In particular, the counter-doping species may comprise boron. The tilted ion implant process 320 may be performed at an angle relative to the normal/perpendicular direction which may vary between about 20-40 degrees, for example.

The ion implant process 320 does not only comprise the implantation of a halo species but, additionally, carbon is co-implanted in order to achieve a reduction of diffusion of the halo species in later processing steps. For example, the halo species, for instance boron, may be implanted during the ion implant process 302 with a tilt angle between 10-50 degrees, for example, 20-40 degrees. Implantation energies for the halo species may be in the range of 5-10 keV, for example, 6-8 keV.

The halo species and carbon may be implanted with the same tilt angle and implantation energy. The density of the halo dopants may be adjusted to about $10^{13}$ to $10^{14}$ cm$^{-2}$. The additional carbon species may be implanted with the same tilt angle as the halo species and comparable implantation energies in the range of 5-10 keV or 6-8 keV. The density of the carbon dopants may be adjusted to about $10^{14}$ to $10^{15}$ cm$^{-2}$. In principle, it might be preferred to match the dopant profiles of the halo component and the co-implanted carbon.

Figure 2C:
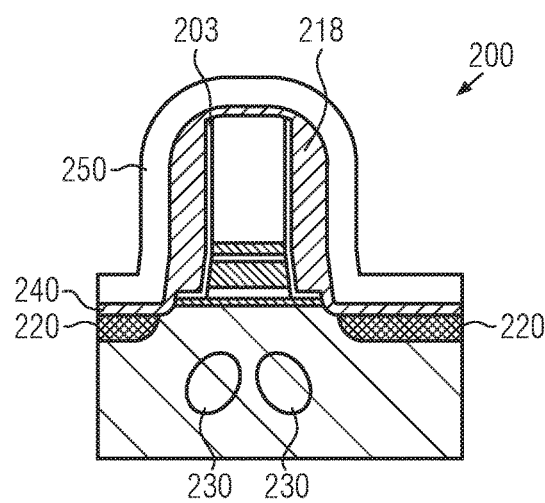

FIG. 2c schematically illustrates the semiconductor device 200 in a further advanced manufacturing stage. Thermal oxidation results in a thin oxide layer 240 formed on exposed parts of the semiconductor layer 201 (and also the first sidewall spacers 218). On the oxide layer 240, a second spacer layer 250 is formed. The second spacer layer 250 may be formed from a nitride material. The second spacer layer 250 is formed to facilitate self-aligned formation of source/drain regions in later processing steps.

Figure 2D:
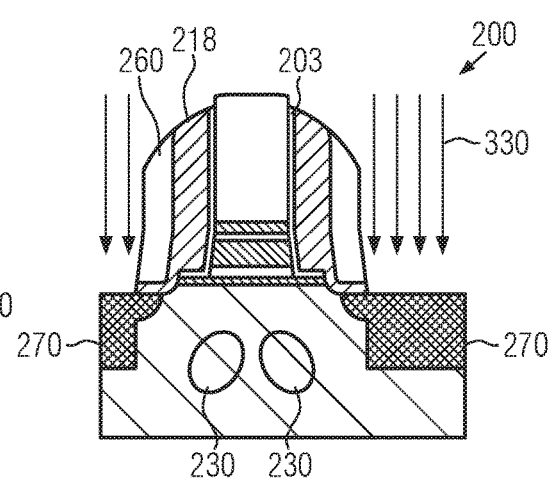

FIG. 2d schematically illustrates the semiconductor device 200 in a further advanced manufacturing stage. In this stage, the second spacer layer 250 has been etched to form second sidewall spacers 260 on the first sidewall spacers 218. Moreover, the thin thermally grown oxide layer 240 has been removed from the top of the polysilicon gate 205 and the surface of the semiconductor layer 201.

After the second sidewall spacers 260 were formed, a third substantially perpendicular ion implantation process 330 is performed to form source/drain implant regions 270 in the semiconductor layer 201. The ion implantation process 330 performed to form the source/drain implant regions 270 may be performed using a higher dopant dose and it is performed at a higher implant energy than the ion implantation process 310 that was performed to fort the extension implant regions 220 (FIG. 2b). The implantation process 330 is performed using N-type dopants for the NMOS transistor to be formed.

A heating or anneal process may be performed on order to repair damages to the lattice structure of the semiconductor layer 201 caused by the implantation processes 310, 320 and 330 and to activate the implanted dopant materials in a manner to adjust the spatial relationship of the source/drain regions 270, source/drain extension regions 220 and halo regions 230. In particular, a spike anneal with a temperature of above some 1000° C. may be performed, for example, at a temperature of about 1050° C., to activate the source/drain species.

Silicidation of the polysilicon gate 205 and/or the source/drain regions 270 may be performed if desired. In principle, the source and drain regions 270 may be formed in a stressed silicon-germanium material previously formed in the semiconductor layer 201. Moreover, the first and second sidewall spacers 218 and 260 may be formed of an intrinsically strained material that exhibits some stress on the gate electrode. An interlayer dielectric may be formed over the structure shown in FIG. 2d and contacts may be formed in the interlayer dielectric to provide for electric contacts to the polysilicon gate material 205 of the gate electrode and the source and drain regions 270.

As a result of the presently disclosed subject matter, in some illustrative embodiments, an N-channel transistor, for example, an N-channel MOSFET, is provided with reduced undesired diffusion of a halo species, for example boron, due to co-implantation of carbon during the implantation of the halo component.

The particular embodiments disclosed above are illustrative only, as the subject matter defined by the appended claims may be modified and practiced in different but equivalent manners apparent to those skilled in the art having the benefit of the teachings herein. For example, some or all of the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the claimed subject matter. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A semiconductor device, comprising:
    an active region comprising a semiconductor layer;
    a transistor formed in and above said active region, said transistor comprising an implanted halo region that comprises a halo dopant species and defines a halo dopant profile in said semiconductor layer; and
    an implanted carbon species positioned in said semiconductor layer, wherein said implanted carbon species defines a carbon species profile in said semiconductor layer that is substantially the same as said halo dopant profile of said implanted halo region in said semiconductor layer; wherein a dopant density of said implanted carbon species in said implanted halo region is greater than a dopant density of said implanted halo species in said implanted halo region.

2. The semiconductor device of claim 1, wherein said transistor further comprises a gate electrode structure positioned above semiconductor layer, source and drain regions positioned in said semiconductor layer, and source and drain extension regions positioned in said semiconductor layer.

3. The semiconductor device of claim 2, wherein said gate electrode structure comprises a gate dielectric layer comprising a high-k dielectric material and a gate electrode comprising a metal-containing material positioned above said gate dielectric layer.

4. The semiconductor device of claim 1, wherein said halo dopant species comprises boron.

5. The semiconductor device of claim 1, wherein said transistor is an N-channel transistor.

6. The semiconductor device of claim 1, wherein said active region is defined by an isolation region.

7. A semiconductor device, comprising:
    a semiconductor layer positioned above a substrate;
    an isolation region positioned in said semiconductor layer and defining an active region, wherein said active region comprises a doped well region comprising dopants of a first conductivity type;
    a transistor formed in and above said doped well region, said transistor comprising an implanted halo region that comprises a halo dopant species having said first conductivity type and defining a halo dopant profile in said semiconductor layer; and
    an implanted carbon species positioned in said semiconductor layer, wherein said implanted carbon species defines a carbon species profile in said semiconductor layer that is substantially the same as said halo dopant profile of said implanted halo region in said semiconductor layer; wherein a dopant density of said implanted carbon species in said implanted halo region is greater than a dopant density of said implanted halo species in said implanted halo region.

8. The semiconductor device of claim 7, wherein said doped well region is a P-well region comprising a first P-type dopant and said transistor is an N-channel transistor.

9. The semiconductor device of claim 8, wherein said halo dopant species comprises a second P-type dopant.

10. The semiconductor device of claim 9, wherein said second P-type dopant comprises boron.

11. The semiconductor device of claim 7, further comprising a gate electrode structure positioned above said active region, said gate electrode structure comprising a gate dielectric layer and a gate electrode formed above said gate dielectric layer.

12. The semiconductor device of claim 11, wherein said gate dielectric layer comprises an interfacial oxide layer positioned on said semiconductor layer and a high-k dielectric layer positioned on said interfacial oxide layer.

13. The semiconductor device of claim 12, wherein said gate electrode comprises a metal-containing layer and a polysilicon layer positioned above said metal-containing layer.

14. The semiconductor device of claim 7, further comprising doped source and drain extension regions positioned in said doped well region, said doped source and drain extension regions comprising dopants of a second conductivity type that is opposite of said first conductivity type, wherein said halo dopant regions are positioned adjacent to and extend below said doped source and drain extension regions.

15. The semiconductor device of claim 14, wherein said doped well region and said halo dopant regions comprise P-type dopants, and wherein said doped source and drain extension regions comprise N-type dopants.

* * * * *